United States Patent [19]

Gould

[11] Patent Number: 4,925,812

[45] Date of Patent: May 15, 1990

[54] PLATINUM DIFFUSION PROCESS

[75] Inventor: Herbert J. Gould, Sherman Oaks, Calif.

[73] Assignee: International Rectifier Corporation, El Segundo, Calif.

[21] Appl. No.: 410,323

[22] Filed: Sep. 21, 1989

[51] Int. Cl.$^5$ .............................................. H01L 21/72
[52] U.S. Cl. ................................... 437/142; 437/192; 437/200; 437/6
[58] Field of Search ................ 357/23.4; 437/142, 99, 437/200, 192, 6

[56] References Cited

U.S. PATENT DOCUMENTS

| | | | |
|---|---|---|---|
| 3,640,783 | 2/1972 | Bailey | 437/142 |
| 3,963,523 | 6/1976 | Tanaka et al. | 437/94 |
| 4,206,540 | 6/1980 | Gould | 437/192 |
| 4,322,453 | 3/1982 | Miller | 437/192 |
| 4,398,344 | 8/1983 | Gould | 437/192 |
| 4,777,149 | 10/1988 | Tanabe et al. | 437/142 |
| 4,855,799 | 8/1989 | Tanabe | 357/23.4 |

FOREIGN PATENT DOCUMENTS 2735769 3/1979 Fed. Rep. of Germany ...... 437/142
0106178. 8/1979 Japan ................................. 437/142

Primary Examiner—Brian E. Hearn
Assistant Examiner—Trung Dang
Attorney, Agent, or Firm—Ostrolenk, Faber, Gerb & Soffen

[57] ABSTRACT

Platinum atoms are uniformly dispersed throughout a silicon wafer containing preformed junctions by depositing a layer of platinum on a clean silicon surface and thereafter immediately heating the wafer to about 500° C. to form platinum silicide. Alternatively, a layer of palladium may be deposited on the surface of the wafer, a layer of platinum is deposited atop the palladium and the wafer is heated to form a palladium silicide with platinum atoms uniformly dispersed throughout the silicide layer. The wafer is heated to about 900° C. for a short time which is sufficiently high to cause the platinum atoms to diffuse into the silicon wafer but is too low and lasts for too short a time to cause the movement of the preformed junctions within the wafer.

25 Claims, 1 Drawing Sheet

PLATINUM DIFFUSION PROCESS

BACKGROUND OF THE INVENTION

This invention relates to a process for introducing platinum atoms into a semiconductor body to reduce the minority lifetime of carriers within the body, and more particularly relates to a novel process which avoids a silicon dioxide barrier to the diffusion of platinum atoms into a silicon wafer.

It is frequently desirable to reduce minority carrier lifetime in semiconductor wafers, die or bodies, which terms are used interchangeably herein. Gold is often used as a lifetime killer but gold tends to increase the leakage current of semiconductor devices at high temperatures. It is also well known to irradiate wafers to reduce minority carrier lifetime, but it has been found that lifetime control induced by radiation is not stable and may anneal out over time and during the die attach process.

Platinum atoms dispersed throughout a semiconductor wafer would provide an extremely effective control of lifetime of minority carriers, will not anneal out as is the case for radiation-treated wafers and does not cause high hot leakage current as is the case with gold. Thus, for the same die, the same silicon specification and for roughly equivalent lifetime reduction, hot leakage currents of 20 microamperes, 400 microamperes and 3500 microamperes are obtained for platinum, electron irradiation and gold, respectively.

The use of platinum as a lifetime killer is disclosed in U.S. Pat. No. 3,640,783. This patent discloses that a silicon wafer can be heated to a temperature adequate to cause platinum to diffuse throughout the body of a silicon wafer but insufficient to cause substantial junction movement. Platinum to kill lifetime is also disclosed in U.S. Pat. No. 3,963,523. It is also known that platinum can be sputter-deposited or co-evaporated with tungsten silicide as disclosed in U.S. Pat. No. 4,322,453 where, however, platinum is not employed as a lifetime killer but is simply intended to increase the conductivity of a tungsten silicide layer. Another disclosure of the desirability of platinum as a lifetime killer is contained in U.S. Pat. No. 4,777,149 in which platinum is applied directly to the surface of a silicon body.

In carrying out processes in which platinum is to be diffused into a silicon wafer, it has been found that a very thin layer of oxide, even one a few atoms thick, will block effective platinum diffusion into a silicon body. It is believed that this problem has prevented the use of platinum as a lifetime killer in commercial products.

The present invention provides a novel method whereby platinum can be diffused into a silicon body which avoids the possibility of the formation of a blocking silicon dioxide layer.

BRIEF DESCRIPTION OF THE INVENTION

In accordance with a first embodiment of the present invention, a palladium silicide layer having platinum dissolved therein is formed on an oxide-free surface of a silicon wafer. Preferably this platinum-containing palladium silicide is formed by first depositing a palladium metal layer on the silicon by an electron beam evaporation process and thereafter depositing a platinum layer atop the palladium layer. These layers are then heated to form a palladium silicide which contains platinum atoms dispersed there-through. The wafer is then heated to a temperature sufficiently high to cause the platinum atoms to diffuse into the silicon but too low and/or for too short a time to cause movement of junctions previously formed in the wafer. Thus, the platinum will diffuse into the silicon free of any possible oxide boundary at the silicon wafer surface. By way of example, the wafer can be heated at 900° C. for 15 minutes. The temperature of 900° C. is about the limit at which junction movement begins but the short time prevents any significant junction movement.

In accordance with a second embodiment of the invention, platinum silicide can be formed directly on the surface of the silicon. Thus, it has been found that, if platinum is deposited on the silicon by e-beam evaporation and the deposited wafer is placed immediately in a furnace to form a silicide, an intervening blocking oxide will not form between the silicon and silicide. The wafer with e-beam deposited platinum is placed immediately into a furnace at about 500° C. in a forming gas or hydrogen gas to form the silicide. The wafer may then be removed from the furnace and stored at leisure. When later processed to diffuse platinum atoms into the wafer, the wafer is heated to about 900° C. for about 15 minutes which is just at or below the temperature at which junctions will move and is too short a time to effect junction movement.

Other features and advantages of the present invention will become apparent from the following description of the invention which refers to the accompanying drawings.

DETAILED DESCRIPTION OF THE DRAWINGS

Figure 1:
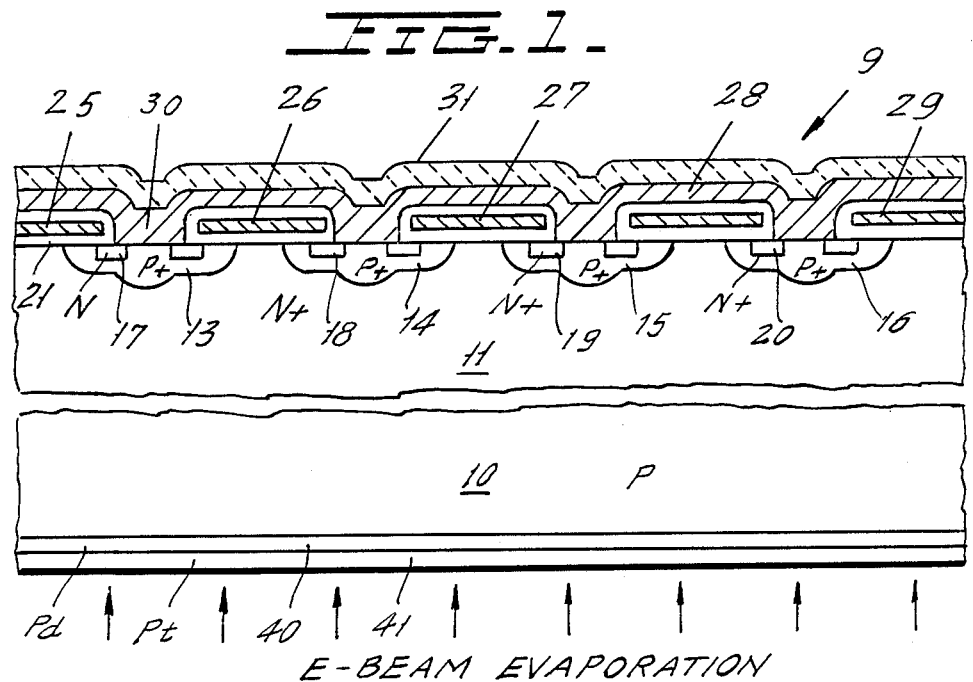
FIG. 1 is an enlarged cross-sectional view in exaggerated scale showing a cross-section of a few cells of a wafer or chip of semiconductor material containing junctions therein for defining an insulated gate bipolar transistor.

Referring to FIG. 1, there is shown therein, in enlarged view, a junction pattern similar to the junction pattern for the power MOSFET disclosed in U.S. Pat. Nos. 4,376,286 and 4,593,302 in a wafer 9 for an insulated gate bipolar transistor. The novel invention can be employed for any semiconductor device which requires reduction of minority carrier lifetime, and can be used in MOSFETs, insulated gate transistors, fast diodes, thyristors, bipolar transistors and the like.

In the device illustrated in FIG. 1, a P type substrate 10 has formed thereon a thin, epitaxial layer 11 which receives various junctions which extend into the wafer from its upper surface.

Schematically illustrated in cross-section are hexagonal base or channel regions 13 through 16, each of which contains respective annular sources 17 through 20 which are of the N type when making an N channel device. The conductivity type of the various regions can be reversed for a P channel device. All of the junctions are planar and extend to the upper surface 21 of the chip or wafer.

The device contains polysilicon gate electrode segments 25 through 29, formed, for example, in the manner disclosed in above-mentioned U.S. Pat. No. 4,593,302, with a suitable gate oxide separating the segments 25 through 29 from the silicon surface 21. A common source or cathode electrode 30 is then formed atop the entire device and contacts the source regions 17 through 20 and the P+ base regions 13 through 16, respectively. The entire front face of the wafer is sealed by appropriate interlayer oxide 31 which may be formed by chemical vapor deposition or the like. Only a few of the cells of the device are shown in FIG. 1 and it should be understood that many thousands of such cells will be contained in the upper surface 21 of the wafer 9.

Figure 2:
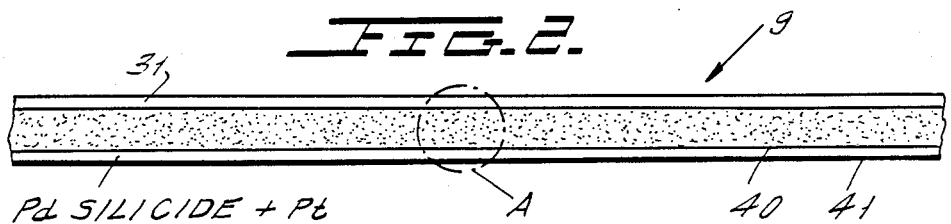
FIG. 2 is an edge view of an entire wafer wherein the area marked with the circle "A" is the enlarged area of FIG. 1.
Figure 3:
FIG. 3 shows the wafer of FIG. 2 after the processing has been completed and silicide is removed from the back surface and a back contact is in place.

FIGS. 2 and 3 show a side view of the upper wafer where, again, dimensions of the device have been grossly exaggerated for purposes of clarity.

It is now possible to describe the manner in which the present invention permits platinum atoms to be uniformly dispersed throughout the wafer 9 of FIG. 1 in order to reduce minority carrier lifetime without causing any movement of the preformed junction patterns within the wafer 9.

It has been found that an extremely thin oxide will block diffusion of platinum atoms into the wafer 9. The present invention provides a novel process whereby the existence of a thin, silicon dioxide blocking layer is avoided and permits diffusion of platinum atoms into wafer 9 at a temperature too low to move the preexisting junction patterns.

More specifically, in accordance with a first embodiment of the invention, a layer of palladium 40 is first formed on a clean bottom surface of the wafer 9 to a non-critical thickness, for example, of about 500 Angstroms. Preferably, the palladium is formed in an e-beam evaporation operation. Palladium will adhere to wafer 9 even in the presence of an oxide film on the wafer. Thereafter, a layer of platinum 41 is formed atop the palladium layer 40, again to a noncritical thickness of about 500 Angstroms.

The wafer with the layers 40 and 41 is then put through a silicide-forming cycle and is, for example, heated to a temperature of 500° C. in an atmosphere of hydrogen and nitrogen gas for about 30 minutes. At the end of this silicide-forming step, a palladium silicide will be formed on the bottom surface of the wafer 9 having platinum atoms uniformly dissolved throughout.

Thereafter, the wafer is put through a platinum diffusion step and the wafer is raised to a temperature of about 900° C. in a nitrogen gas or combined nitrogen and oxygen gas atmosphere for about 15 minutes.

The platinum diffusion cycle is terminated with the quickest practical cool-down rate. Thus, it has been found that the faster the cool down, the better is the performance of the resulting devices in terms of smaller on-resistance and switching loss. During the heating step, platinum will diffuse from the silicide into and uniformly throughout the wafer 9. Therefore, platinum is appropriately distributed throughout the wafer to reduce minority carrier lifetime during the operation of the device.

Since the platinum diffuses at 900° C., the junctions previously formed in the wafer will not be moved during the platinum diffusion step. It is further noted that the palladium in the silicide will not diffuse into the wafer 9 during this diffusion step since palladium will diffuse only at about 1,120° C. Furthermore, if palladium were chosen to be the heavy metal for lifetime control, the required diffusion temperature is so high that it would also cause movement of the preformed junctions in the device.

It will be noted that the presence of the interlayer 31 prevents contamination of the upper surface of the device by palladium or platinum.

The silicide and platinum on the bottom surface of wafer 9 are removed as by sandblasting and etching and a conventional back contact 42, shown in FIG. 3, is applied to the back of the device. Alternatively, the bottom or back surface of the wafer can be ground to remove the silicide. The wafer front surface is suitably coated with a protective surface before this operation and the coating is later removed. It is desirable to remove the palladium silicide since conventional back side metallizations will not adhere reliably to the undisturbed back surface following platinum diffusion. Back contact 42 corresponds to the drain contact shown in U.S. Pat. No. 4,593,302. It can act as the anode contact of an IGBT.

In accordance with a second embodiment of the invention, the palladium step described above is skipped, and platinum is e-beam evaporated directly on the oxide-free back surface of wafer 10. Immediately thereafter, and without any of the ordinary production line delays, the wafer is placed in a furnace heated to 500° C. and filled with a suitable forming gas to form a platinum silicide. Thereafter, the wafer can be stored as desired and the silicide-silicon interface is protected against the formation of an oxide. The wafer may next be processed as described above to diffuse platinum atoms from the platinum silicide into the body of wafer as by heating the wafer above 850° C. and preferably to 900° C., and to a temperature just less than that which will cause the preformed junctions to move. Note that while junctions may move at 900° C., the time of 15 minutes is too brief to cause significant junction movement.

The exact point in the wafer fab process at which platinum is applied is preferably just prior to cutting the windows for the source and gate metallizing since, at this point, the entire upper surface of the wafer is capped with a thick deposited glass 31. This is preferably augmented by another thick organic film, not shown, consisting of a wax dissolved in a solvent which is coated on the wafer face atop layer 31. The solvent is driven off by air drying followed by baking. Alternatively, an unpatterned photoresist could be applied atop layer 31.

In order to ensure an oxygen-free back surface before platinum is deposited, oxide is first etched off the back side of the wafer by a suitable buffered oxide etch. Alternatively, a dilute HF etch can be used. A few microns of silicon are removed from the back surface by a subsequent etch. For example, 8 microns of silicon can be removed by a 60 second etch in 9:2:4 (nitric acid/hydrofluoric acid/acetic acid). The removal of this surface layer ensures removal of dissolved oxygen and traces of phosphorus and arsenic, and structural disorders at the surface. It also removes the shallow boron-poor surface region which may be formed by out-diffusion of boron during the growth of thermal oxides. This etch step ensures the effectiveness of the subsequent silicide formation step.

Following the etch, the wax film is stripped off. An initial vapor-degreaser step will remove almost all of the wax, followed by several suitable solvent baths to remove all residual wax.

A conventional pre-evaporation cleaning process is then carried out. For example, the wafer may be soaked in a fresh mixture of 1:1 concentrated sulfuric acid to 30% hydrogen peroxide for 15 minutes. This mixture self-heats upon mixing to about 120° and has strong oxidizing properties. The wafer is then rinsed in deionized water.

Thin chemical oxides grow on the silicon wafer back surface during the pre-evaporation cleaning and these are removed by a brief etch in highly dilute HF, for example, 1 to 100 (HF to water) for 15 seconds. The wafer is then rinsed in deionized wafer and, following a spin dry, is immediately loaded into the evaporator and the pump down is immediately commenced for the subsequent platinum and/or palladium/platinum deposition.

After loading the wafer in the evaporator, and after achieving vacuum, the wafer is preferably heated to about 150° C. This will desorb moisture and gases and allows for a more intimate contact between the silicon and the deposited metal. Also, the kinetic energy of depositing platinum atoms will be augmented by the thermal energy of the silicon substrate. The metal deposited is then heated to about 500° C. to form the silicide on the back surface which is free of an oxide barrier to the silicon wafer.

It is extremely important that the steps between the final clean of the silicon back surface through to silicide formation be uninterrupted, following immediately one after another. The platinum diffusion step then follows.

Thereafter, the back side is sandblasted and etched, with the front surface coated with a protective coating during this operation. Alternatively, the back side can be ground. In either case, a conventional chrome-nickel-silver back contact layer can then be applied to the rear surface of the wafer.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for introducing platinum atoms into a semiconductor body to reduce minority carrier lifetime comprising the steps of forming a layer of palladium on a surface of said semiconductor body, and thereafter forming a layer of platinum atop said palladium layer and thereafter heating said semiconductor body, said palladium and said platinum layers to a first temperature sufficient to form palladium silicide having platinum atoms uniformly dissolved in said layer of palladium silicide, and thereafter heating said semiconductor body and said palladium silicide to a second and higher temperature sufficiently high and for a sufficiently short time to cause platinum atoms to diffuse into said semiconductor body but which is too low to cause palladium atoms to diffuse into said semiconductor body.

2. The process of claim 1 wherein said second temperature is about 900° C.

3. The process of claim 1 wherein said palladium and platinum layers are deposited on said semiconductor body by electron beam evaporation.

4. The process of claim 1 wherein said semiconductor body contains at least one P-N junction therein; said junction being formed in said semiconductor body in a step which precedes said step of heating said semiconductor body to cause diffusion of said platinum atoms into said semiconductor body.

5. The process of claim 4 wherein said palladium and platinum layers are deposited on said semiconductor body by electron beam evaporation.

6. The process of claim 1 wherein said semiconductor body comprises a thin, flat wafer of monocrystalline silicon.

7. The process of claim 1, wherein said semiconductor body contains a plurality of P-N junctions therein.

8. The process of claim 7 wherein the position of said plurality of P-N junctions remains stable at said second temperature.

9. The process of claim 1 wherein said layer of palladium silicide is removed from said semiconductor body after diffusing said platinum atoms into said semiconductor body.

10. The process of claim 4 wherein said layer of palladium silicide is removed from said semiconductor body after diffusing said platinum atoms into said semiconductor body.

11. The process of claim 8 wherein said layer of palladium silicide is removed from said semiconductor body after diffusing said platinum atoms into said semiconductor body.

12. A process for diffusing lifetime-reducing atoms of a heavy metal into a silicon body containing P-N junctions at a temperature too low to distort the positions of said P-N junctions; said process comprising the steps of depositing a silicide-forming metal on a surface of said silicon body; said silicide-forming metal diffusing into silicon at a higher temperature than the temperature at which said heavy metal diffuses into silicon; and depositing a layer of said heavy metal atop said silicide-forming metal, and then heating said silicon body to a first temperature sufficient to form a silicide whereby atoms of said heavy metal disburse throughout said silicide, and thereafter heating said silicon body to a second and higher temperature and for a short time sufficient to cause said atoms of said heavy metal to diffuse into said silicon body but too low to cause movement of said P-N junctions within said silicon body.

13. The process of claim 12 wherein said silicide is removed from said silicon body after said heavy metal atoms diffuse into said silicon body.

14. The process of claim 12 wherein said silicide-forming metal is palladium.

15. The process of claim 12 wherein said heavy metal is platinum.

16. The process of claim 14 wherein said heavy metal is platinum.

17. The process of claim 16 wherein said silicide is removed from said silicon body after said heavy metal atoms diffuse into said silicon body.

18. The process of claim 15 wherein said second temperature is about 900° C.

19. The process of claim 16 wherein said temperature is about 900° C.

20. A process for introducing platinum atoms into a silicon wafer to reduce minority carrier lifetime comprising the steps of forming a layer of platinum on the back surface of a silicon wafer which has a pattern of P-N junctions formed into its opposite surface; and immediately thereafter and before an oxide can form between said layer of platinum and said silicon wafer, heating said wafer to form a platinum silicide on said back surface which is free of an intervening oxide layer, and thereafter diffusing platinum atoms from said silicide into said wafer by heating said wafer to a temperature higher than about 850° C. but lower than the temperature at which said junctions will move within said wafer 21. The process of claim 20 wherein said platinum layer is formed by electron beam evaporation.

22. The process of claim 20 wherein said wafer is heated in a forming gas atmosphere to form said silicide.

23. The process of claim 21 wherein said wafer is heated in a forming gas atmosphere to form said silicide.

24. The process of claim 20 wherein said silicide is removed from said wafer after diffusing platinum atoms into said wafer.

25. The process of claim 22 wherein said silicide is removed from said wafer after diffusing platinum atoms into said wafer.

* * * * *